United States Patent
Bakshi

(10) Patent No.: US 8,443,335 B2
(45) Date of Patent: May 14, 2013

(54) APPARATUS AND METHOD FOR CIRCUIT DESIGN

(75) Inventor: Anupam Bakshi, Noida (IN)

(73) Assignee: Agnisys, Inc., Lowell, MA (US)

( * ) Notice: Subject to any disclaimer, the term of this patent is extended or adjusted under 35 U.S.C. 154(b) by 0 days.

(21) Appl. No.: 13/481,814

(22) Filed: May 26, 2012

(65) Prior Publication Data

US 2012/0240022 A1   Sep. 20, 2012

Related U.S. Application Data

(63) Continuation-in-part of application No. 12/634,192, filed on Dec. 9, 2009, now Pat. No. 8,316,330.

(51) Int. Cl.
  *G06F 17/50*  (2006.01)
(52) U.S. Cl.
  USPC .......................... 716/139; 716/137; 716/138
(58) Field of Classification Search .................. 716/137, 716/138, 139
  See application file for complete search history.

(56) References Cited

U.S. PATENT DOCUMENTS

| | | | | |
|---|---|---|---|---|
| 5,541,850 A * | 7/1996 | Vander Zanden et al. | ..... | 716/102 |
| 5,940,603 A * | 8/1999 | Huang | ........................ | 716/103 |
| 5,984,510 A * | 11/1999 | Guruswamy et al. | ........... | 716/54 |
| 7,406,674 B1 * | 7/2008 | Ogami et al. | .................. | 716/117 |
| 8,042,093 B1 * | 10/2011 | Ogami | ........................ | 717/109 |
| 8,069,428 B1 * | 11/2011 | Ogami et al. | .................. | 716/117 |
| 2003/0172045 A1 * | 9/2003 | Rindner | ........................... | 707/1 |

* cited by examiner

*Primary Examiner* — Stacy Whitmore
*Assistant Examiner* — Mohammed Alam
(74) *Attorney, Agent, or Firm* — Patentry

(57) ABSTRACT

A word processing or spreadsheet application is augmented by a plug-in and templates for computer aided design of electronic hardware entities. The plug-in utilizes the application programming interface to provide a menu system and executable code which inserts templates, reads and validates data entered into the template, computes addresses, annotates addresses and error messages back to a word processing document for display in the editor of the word processing document, and upon selection and request, generates output files for target simulators or synthesis tools.

6 Claims, 12 Drawing Sheets

```
16  package blkGroup0_xrsl_pkg is
17
18
19          type blkGroup0_inrec is record -- all fields writable by HW
20          VR_VR : std_logic_vector(31 downto 0);
21                  UPR_UPR : std_logic_vector(31 downto 0);
22
23          end record;
24
25          constant blkGroup0_inrec_z : blkGroup0_inrec := (
26          VR_VR => (others => 'Z'),UPR_UPR => (others => 'Z')
27          );
28
29
30          type blkGroup0_outrec is record -- all fields readable by HW
31          VR_VR : std_logic_vector(31 downto 0);
32                  UPR_UPR : std_logic_vector(31 downto 0);
33
34          end record;
35
36
37              -- Input enables for each individual fields that are writable by Hardware.
38              -- When high, the corresponding field location in the register is written
39
```

FIG. 7

```
11    #ifndef _OPENRSC_REGS_H_
12    #define _OPENRSC_REGS_H_
13    //block : blk_Group0
14
15
16    typedef union {
17      struct {
18        unsigned VR : 32; // ro    0:31
19      } bf;
20    hw32 dw;
21    } openrsc_blkGroup0_VR;
22
23
24    typedef union {
25      struct {
26        unsigned UPR : 32; // ro    0:31
27      } bf;
28    hw32 dw;
29    } openrsc_blkGroup0_UPR;
30
31    typedef struct {
32      openrsc_blkGroup0_VR   VR;
33      openrsc_blkGroup0_UPR  UPR;
34
35    } openrsc_blkGroup0_s;
36
37    // chip : open_rsc
38
```

FIG. 8

| 1.1.1 : Reg : VR |||||||||||||||||||||||||||||||||
|---|---|---|---|---|---|---|---|---|---|---|---|---|---|---|---|---|---|---|---|---|---|---|---|---|---|---|---|---|---|---|---|
| 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |

| Reg bits | Field name | sw | hw | default | Description |
|---|---|---|---|---|---|
| 31:0 | VR | ro | rw | 0x0 | Version Register |

FIG. 9

```
        // block : blkGroup0
<spirit:register xmlns:spirit="http://www.spiritconsortium.org/XMLSchema/SPIRIT/1.4">
    <spirit:name>VR</spirit:name>
    <spirit:description/>
    <spirit:addressOffset>0x000000</spirit:addressOffset>
    <spirit:size>32</spirit:size>
    <spirit:volatile>true</spirit:volatile>
    <spirit:field>
        <spirit:name>VR</spirit:name>
        <spirit:description>Version Register</spirit:description>
        <spirit:bitOffset>0</spirit:bitOffset>
        <spirit:bitWidth>32</spirit:bitWidth>
        <spirit:access>read-only</spirit:access>
    </spirit:field>
</spirit:register>
<spirit:register xmlns:spirit="http://www.spiritconsortium.org/XMLSchema/SPIRIT/1.4">
    <spirit:name>UPR</spirit:name>
    <spirit:description/>
    <spirit:addressOffset>0x000004</spirit:addressOffset>
    <spirit:size>32</spirit:size>
    <spirit:volatile>true</spirit:volatile>
    <spirit:field>
        <spirit:name>UPR</spirit:name>
```

FIG. 10

APPARATUS AND METHOD FOR CIRCUIT DESIGN

This application is a continuation-in-part of pending application Ser. No. 12/634,192 filed Dec. 9, 2009 which is incorporated by reference in its entirety.

BACKGROUND

1. Field

This disclosure is generally related to electric and electronic circuit design and in particular to tools for designing electronic devices, such as Application Specific Integrated Circuits (ASICs), Field Programmable Gate Arrays (FPGAs), boards, and systems.

2. Description of Related Art

Typical chip design involves working with traditional documents, such as documents describing a chip or a test plan for a chip. Document editors, such as word processors, generate such documents.

Several varieties of front-end input tools are available for designing a typical chip. Such front end input tools may be GUI-based (Graphical User Interface based), web-based, and language-based. The present disclosure relates to a system and method for designing an electric or electronic circuit. The following abbreviations or acronyms may appear in the present disclosure:

VHSIC: Very High Speed Integrated Circuit,
Verilog: A hardware description language,
CSV: Comma Separated Values, typically generated by EXCEL® (Trademark of Microsoft Corporation),
OpenXML: An open data storage format using XML, where XML: eXtensible Markup Language,
C/C++h: C and C++ are software programming languages, where h refers to the header files having constants and data structures,
OVM: Open Verification Methodology, is a hardware verification method promoted by Mentor Graphics, Inc. and Cadence Design Systems, Inc.,
VMM: Verification Methodology Manual, is a hardware verification method promoted by Synopsys, Inc.,
API: Application Programmer's Interface, and
Tcl: Tool Command Language.

As a person having an ordinary skill in the art would appreciate, an arrow entering a block or a symbol indicates an input and an arrow leaving a block or a symbol indicates an output. Similarly, connections described below may be of any electromagnetic type, such as electrical, optical, radio-frequency, and magnetic.

Further, a hardware interface or a software interface may indicate one or more registers and one or more properties of the one or more registers. The hardware interface or a software interface may indicate one or more bits of a register and one or more properties of the one or more bits of the one or more registers. The hardware interface or the software interface may indicate a sequence of steps and one or more properties of the steps related to turning on a device having an electric or electronic circuit. The hardware interface or the software interface may indicate an acceptable register value or an acceptable bit value.

A "derived view" may indicate one or more files generated from a document describing the device. The derived views may include an RTL description for a hardware synthesis, a C/C++ header file for a device driver, a C/C++ header file for a firmware and a C/C++ header file for developing a software, a test file for describing the device and the software, and a documentation file for describing the device. All output files may be "derived views" but those related to a device design, such as RTL, VHDL, and Verilog files may be termed "design views."

BRIEF SUMMARY

Embodiments of the present disclosure provide a method and system for designing an electric or electronic circuit. The present disclosure teaches how to make a tool to design an electric or electronic circuit, such as an ASIC or an FPGA.

Briefly described, in architecture, one embodiment of the method, among others, can be implemented as follows. The method may include providing a description of a device; including at least one feature of the device in the description; adding an information pertaining to the at least one feature; configuring the description to detect a relationship between the information and the at least one feature; and generating a message conveying the relationship.

The present disclosure can also be viewed as a system where the system may include a first processor configured to provide a description of a device; a second processor, the second processor coupled to the first processor, and the second processor being configured to include at least one feature of the device in the description; an adder, the adder coupled to the first processor, and the adder being configured to add an information pertaining to the at least one feature; a detector, the detector coupled to the first processor, and the detector being adapted to configure the description to detect a relationship between the information and the at least one feature; and a generator, the generator coupled to the first processor, and the generator being coupled to generate a message conveying the relationship.

Other systems, methods, features, and advantages of the present invention will be, or will become, apparent to a person having ordinary skill in the art upon examination of the following drawings and detailed description. It is intended that all such additional systems, methods, features, and advantages included within this description, be within the scope of the present disclosure, and be protected by the accompanying claims. The present disclosure relates to a system and method for designing an electric or electronic circuit. The following abbreviations or acronyms may appear in the present disclosure:

VHSIC: Very High Speed Integrated Circuit,
Verilog: A hardware description language,
CSV: Comma Separated Values, typically generated by EXCEL® (Trademark of Microsoft Corporation),
OpenXML: An open data storage format using XML, where XML: eXtensible Markup Language,
C/C++h: C and C++ are software programming languages, where h refers to the header files having constants and data structures,
OVM: Open Verification Methodology, is a hardware verification method promoted by Mentor Graphics, Inc. and Cadence Design Systems, Inc.,
VMM: Verification Methodology Manual, is a hardware verification method promoted by Synopsys, Inc.,
API: Application Programmer's Interface, and
Tcl: Tool Command Language.

Further, a hardware interface or a software interface may indicate one or more registers and one or more properties of the one or more registers. The hardware interface or a software interface may indicate one or more bits of a register and one or more properties of the one or more bits of the one or more registers. The hardware interface or the software interface may indicate a sequence of steps and one or more properties of the steps related to turning on a device having an electric or electronic circuit. The hardware interface or the software interface may indicate an acceptable register value or an acceptable bit value.

A "derived view" may indicate one or more files generated from a document describing the device. The derived views may include an RTL description for a hardware synthesis, a C/C++ header file for a device driver, a C/C++ header file for a firmware and a C/C++ header file for developing a software, a test file for describing the device and the software, and a documentation file for describing the device. All output files may be "derived views" but those related to a device design, such as RTL, VHDL, and Verilog files may be termed "design views."

BRIEF DESCRIPTION OF THE SEVERAL VIEWS OF THE DRAWINGS

Many aspects of the disclosure can be better understood with reference to the following drawings. Components in the drawings are not necessarily to scale, emphasis instead being placed upon clearly illustrating the principles of the present invention:

FIG. 7 illustrates an exemplary VHDL (Very-high-speed integrated circuit Hardware Description Language) output;

FIG. 8 illustrates a C/C++ header;

FIG. 9 illustrates an HTML (HyperText Markup Language) output;

FIG. 10 illustrates an exemplary IP-XACT® (Trademark of The Spirit Consortium) output;

DETAILED DESCRIPTION

Figure 1:
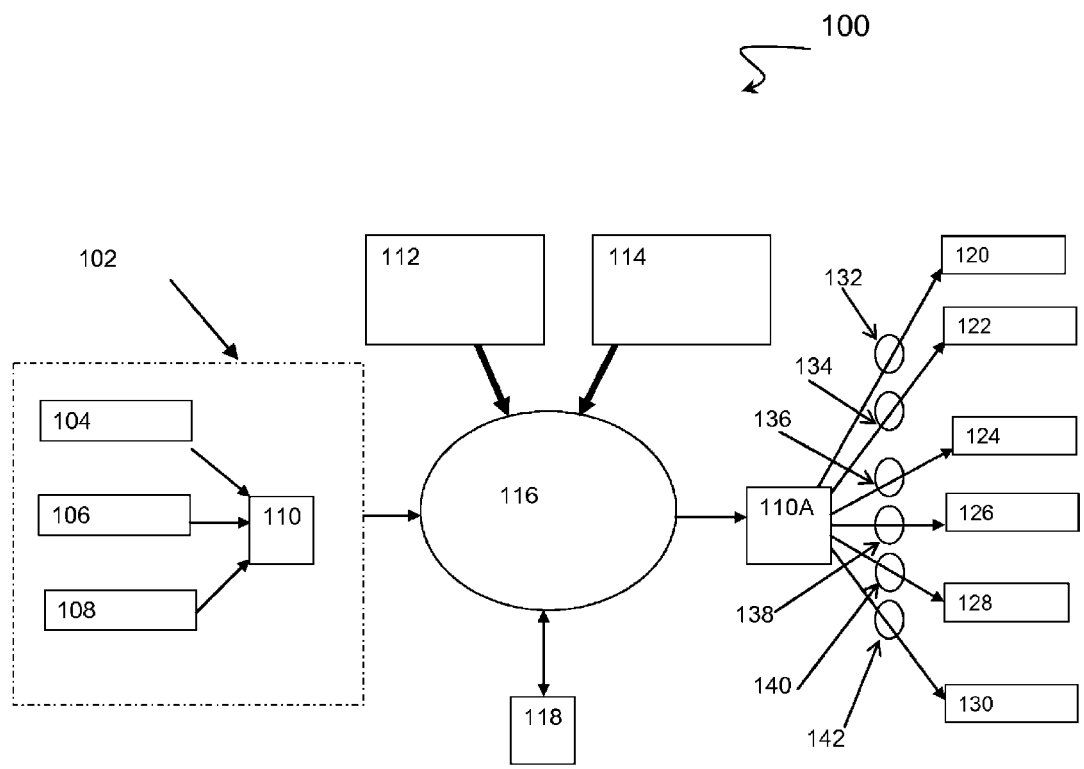
FIG. 1 illustrates a block diagram of an embodiment of an editor.

The present disclosure may enable a creation of a description of the device in the document, typically generated in a document editor, and insert one or more templates, described in more detail below, in the document that may detect one or more errors as information is entered in the document or in the one or more templates. Such detection of an error may modify the document in a dynamic manner. The document may drive a process to develop the device. The document editor may be capable of generating the document that may be a general-purpose document or a special-purpose document. Checks may be performed on the document for a semantic consistency. A user may have an option to generate several derived views from the document describing the device.

The present disclosure may adapt a word processor, such as a word processor program, capable of generating the document, for having an ability to add "templates" for register, reg_group, block, chip, board and system, as well as for "check" and "generate," as described below, where templates may be tables having a predefined layout and format. "Embedded templates" may be templates which may be embedded in an editable document. If data are entered in the embedded template form, an embodiment of the present disclosure may locate and process such data. Each register may have additional data such as a constraint on a value of the register such as, but not limited to, an enumerated type. Each register may have one or more additional properties such as a soft reset value or a mask. This information may be used to generate additional program code to help ensure a compliance to the constraints at run time of a simulator or the device. The constraint may be on a register or on one or more field values. The constraint may be an enumerated list, a range, or another constraint.

The present disclosure may adapt the word processor to check for a consistency as data are entered into one or more of the tables, and generate a feedback, such as a visual feedback to the user. When data may be written out, further consistency checks may be performed and an XML file may be generated. An XSLT or Tcl transformer may be used to verify the data, generate one or more addresses, one or more heading numbers, and annotate the XML file with one or more attributes. The addresses, headings, and error messages, if any, may be transmitted to the word processor, such as an editor, for display. If the derived view is to be generated, as selected by the user, another XSLT or Tcl transformation may be performed wherein one or more output files may be generated as selected by the user, optionally generating a feedback related to the one or more output files.

An embodiment of the present disclosure may be implemented in an editor, or the word processor as described above. A preferred embodiment may employ a language that is supported by a core API of the editor or the word processor. A transformation from a specification of the device, such as the document, to the one or more output files may be carried out by using XSLT as well as by using any appropriate programming or scripting language such as Tcl.

FIG. 1 illustrates a block diagram of an embodiment of an editor in a system 100. In the system 100, a batch input 102 may include an IP-XACT® file 104, a CSV file 106, an EXCEL® file 108 input to an XML processor 110, wherein an output of the XML processor 110 may be coupled to an editor 116. The editor 116 may receive inputs from a functional specification 112, such as a part or all of the specification of the device, and a register specification 114. The functional specification 112 and the register specification 114 may pertain to the device described above or another system. The editor 116 may be coupled to an OpenXML processor 118 and an XML processor 110A at an output of the editor 116. The OpenXML processor 118 may process a data format used by OpenOffice. Such processing may store document in an exemplary manner in an embodiment of the present disclosure. Another word processor may have its own proprietary data storage format. In a given application, the XML processor 110 and the XML processor 110A may be combined. The XML processor 110A may be coupled, via a respective XSL transformer 132, 134, 136, 138, 140, 142, to one or more of a VHDL file 120, a Verilog file 122, a C/C++h file 124, an IP-XACT® file 126, one or more OVM files 128, and one or more VMM files 130. In the context of the present disclosure, XML processing indicates a platform independent data transformation.

Figure 2:
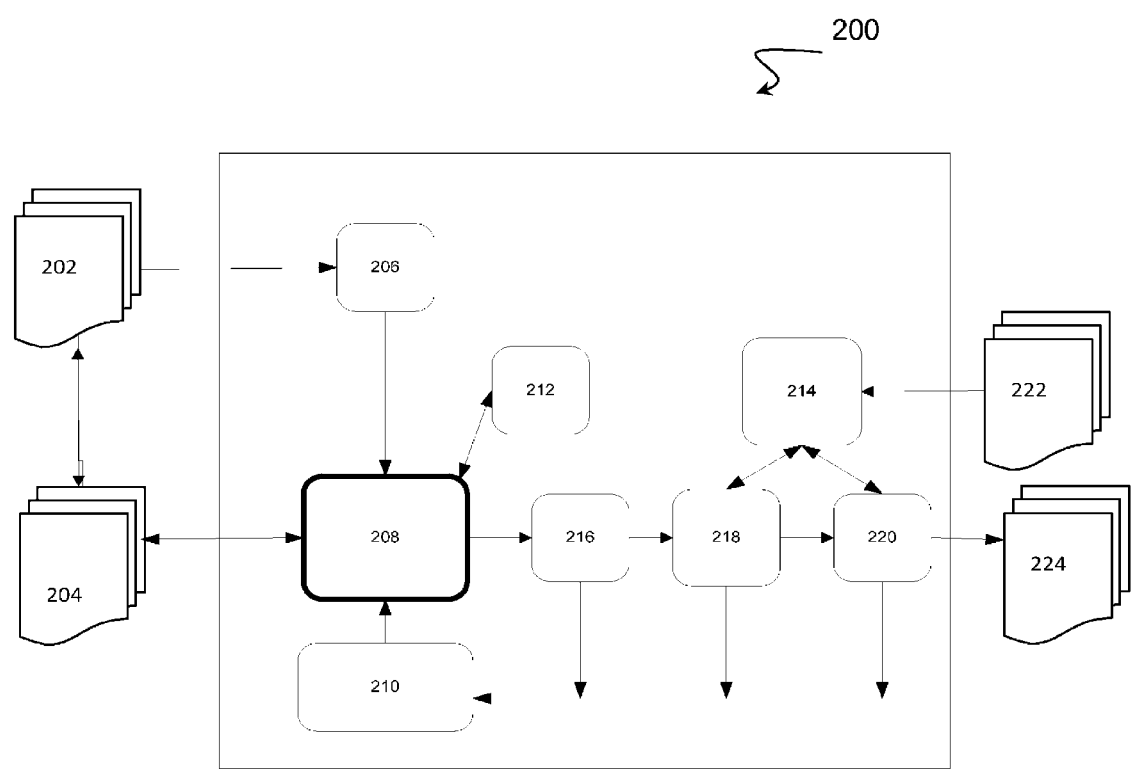
FIG. 2 illustrates a block diagram of an embodiment of an editor GUI (Graphical User Interface)

FIG. 2 illustrates a block diagram of an embodiment of an editor GUI 208. All components described herein may run, as described in more detail below, in a single operating system process. In a system 200, the editor GUI 208 may be coupled to at least one saved editor file 204, an input reader 206, an error and annotation handler 210, a template handler 212, and a semantic validator 216. The input reader 206 may parse at least one input file 202 and pass the at least one input file 202 to the editor GUI 208 to show in an appropriate format using one or more predefined templates. The error and annotation handler 210 may create and update the document shown in the editor GUI 208. The template handler 212 may handle one or more events in one or more templates. The semantic validator 216 may check data entered by the user for validity. The semantic validator 216 may be a syntax checker and may check hierarchy as well.

The at least one input file 202 may be coupled to the at least one saved editor file 204 and the input reader 206. The semantic validator 216 may be coupled to an annotation generator 218, and the annotation generator 218 may be coupled to an output generator 220. The annotation generator 218 may check for overall errors in the data entered by the user in the context of a digital hardware system. Each of the semantic validator 216, the annotation generator 218, and the output generator 220 may be coupled to the error and annotation handler 210. An XSL transformer 214 may be coupled to the annotation generator 218 and the output generator 220. At least one XSL file 222 may be input to the XSL transformer 214. The output generator 220 may generate at least one output file 224. The output generator 220 may employ an appropriate XSL transformation to create at least one output file 224 and any errors generated in the process may be shown in the editor GUI 208.

The user may create the document using the editor GUI 208. The user may insert at least one template and may set at least one property of the at least one template. Any data entered may be validated by the semantic validator 216. On operating a "Check" button, described below, more semantic checks may be performed, at least one annotation may be generated in the annotation generator 218 and fed back to the editor GUI 208 through the error and annotation handler 210. On operating a "Generate" button, described below, the same process as that for the "Check" may be repeated. In addition to the "Check" functionality, the output generator 220 may get called thereby creating the appropriate files, such as the at least one output file 224. Any errors generated or detected during a generation process may be displayed in the editor GUI 208.

In the generation process, the user's description may be transformed into an XML representation. The XML representation may be run through the semantic validator 216, the annotation generator 218, and the output generator 220. The annotation generator 218 may check for at least one error, may calculate at least one address, and at least one heading which may be annotated onto an original file processed by an embodiment of the present disclosure through the error and annotation handler 210. That is, the original file having the specification of the device may be processed into the document by the embodiment of the present disclosure through the error and annotation handler 210 and components described above. An address calculation may be dynamic and error display may be restricted to the document only. For each output there may be a corresponding XSL or Tcl file.

During an output generation, the XML representation may be transformed using a specified XSL or Tcl file. Any errors generated or detected during the output generation may be annotated back to the original file.

An embodiment of the present disclosure may be implemented as a plugin into the editor. The editor may be provided additional functionality by way of a tool bar, a menu bar, and a set of templates that may be inserted in the document when appropriate buttons may be pressed, or activated in another manner known in the art, in the toolbar or items selected from the menu bar. The menu bar may be included as known in the art.

Figure 3:
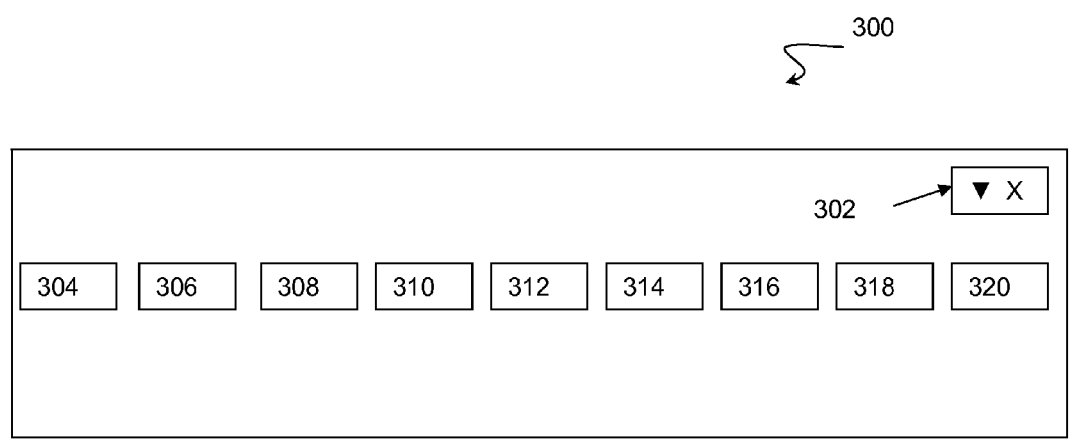
FIG. 3 illustrates a toolbar of the editor.

FIG. 3 illustrates a toolbar 300 of the editor. The toolbar 300 may include a button 302 typically including icons for minimizing the toolbar 300 and closing the toolbar 300, and buttons for configuration 304, system 306, board 308, chip 310, block 312, reg_group 314, register 316, check 318, and generate 320.

The configuration 304 may include one or more settings for the system 306 for selecting which output(s) may be generated. The configuration 304 may include one or more settings for one or more user customizations. Operating the system 306 button may insert a system template in the document. Operating the board 308 button may insert a board template in the document. Operating the chip 310 button may insert a chip template in the document. Operating the block 312 button may insert a block template in the document. Operating the reg_group 314 button may insert a register group template in the document. Operating the register 316 button may insert a register template in the document. Operating the check 318 button may verify a correctness of the data, show errors, if any, in the document, may calculate a data address or a register address based on a location of one or more templates, and may annotate the addresses in the template in the document. Operating the generate 320 button may create the one or more output files, such as the at least one output file 224 of FIG. 2, as selected by the configuration 304.

The templates may serve as a means for the user to create one or more entities such as the registers 316, register groups or the reg_groups 314, the blocks 312, the chip 310, the board 308, and the system 306. The user may insert the templates and may enter properties of the templates. It may be noted that there may be more than one chip 310, more than one board 308, and more than one system 306.

The user may create a hierarchy in the system 306 by using the templates. For example, all of the registers following a first block up until the next block, chip, board or system may be considered to be included in the first block. Similarly, all of the blocks following a first chip up until the next chip, board or system may be considered to be included in the first chip. A register group may be special, as the register group may have two templates, e.g., a start template and an end template. Registers and other register groups may be included in a register group. This enables a practically infinite depth in the hierarchy.

Figure 4:
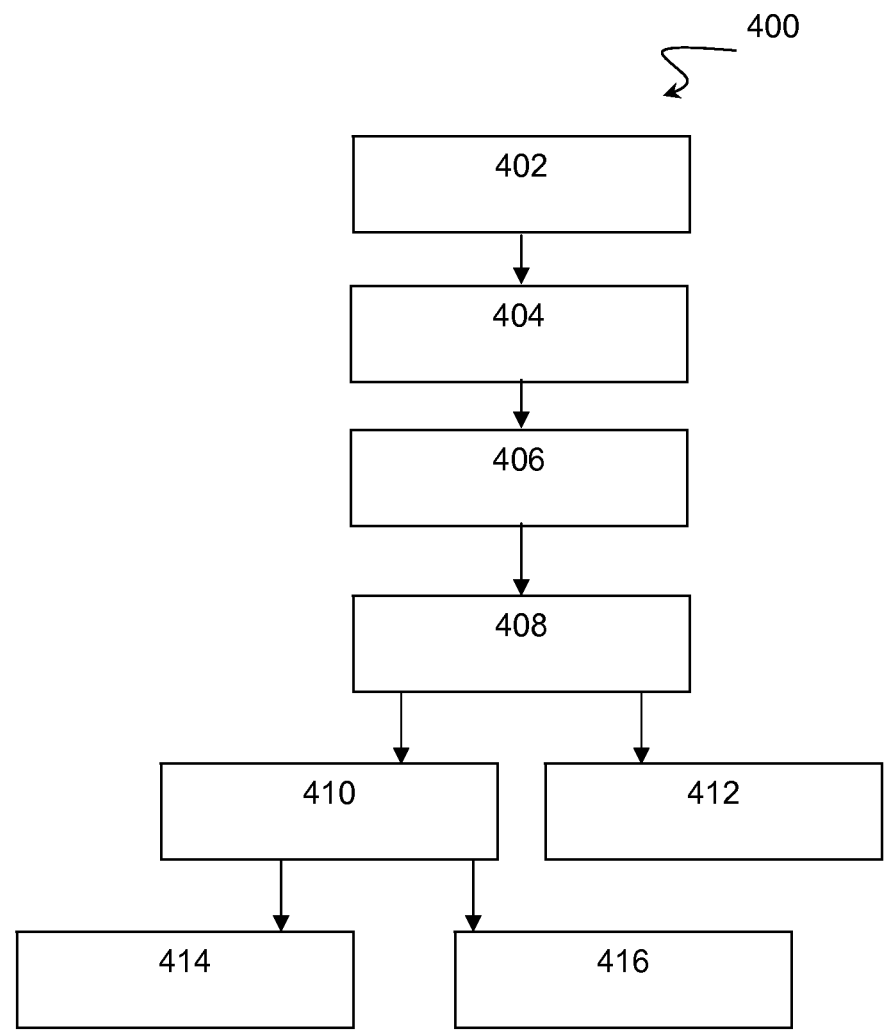
FIG. 4 illustrates an exemplary hierarchy in a system.

In an exemplary embodiment of the present disclosure, the hierarchy for the system 306 may be shown as illustrated in FIG. 4. The hierarchy for the system 306 may be a hierarchy 400 wherein a system 402 may be coupled to a board 404, the board 404 may be coupled to a chip 406, the chip 406 may be coupled to a block 408, wherein in a first branch, the block 408 may be coupled to a reg_group 410, the reg_group 410 being coupled to a reg_group 414 and a register 416, and in a second branch, the block 408 may be coupled to a register 412.

Figure 5:
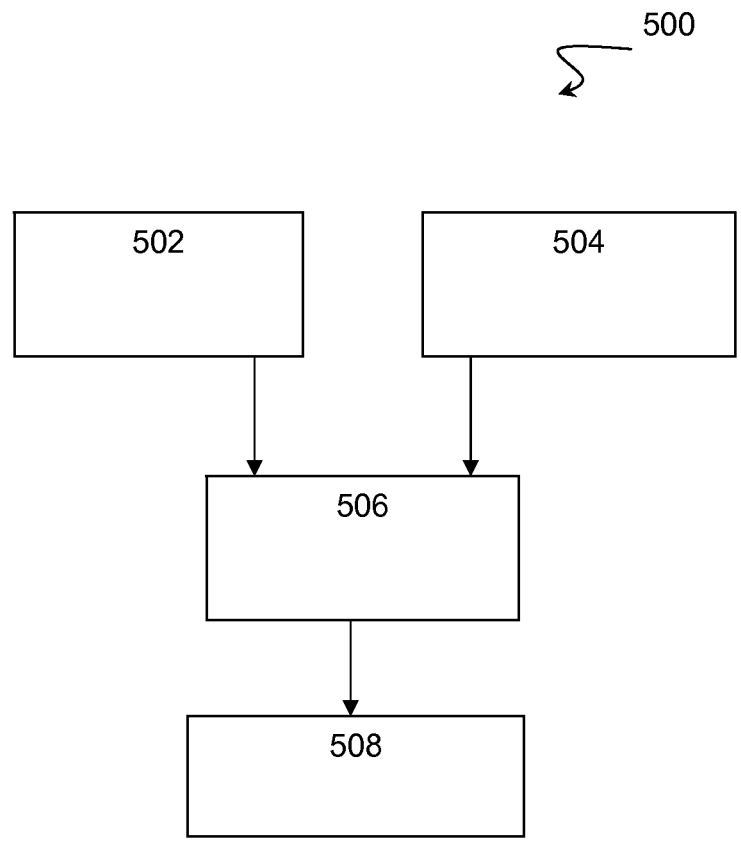
FIG. 5 illustrates a block diagram of an XSLT (eXtensible Stylesheet Language Transformation)

FIG. 5 illustrates a block diagram of an XSLT transformer 500. An XSLT code 502 and an XML input 504 may be input to an XSLT processor 506. The XSLT processor 506 may generate an output document 508, such as the at least one output file 224 of FIG. 2. It may be possible for the user to modify or customize the generated output, such as the output document 508 or the at least one output file 224 of FIG. 2, by modifying the XSLT files or by creating a Tcl program.

Figure 6:
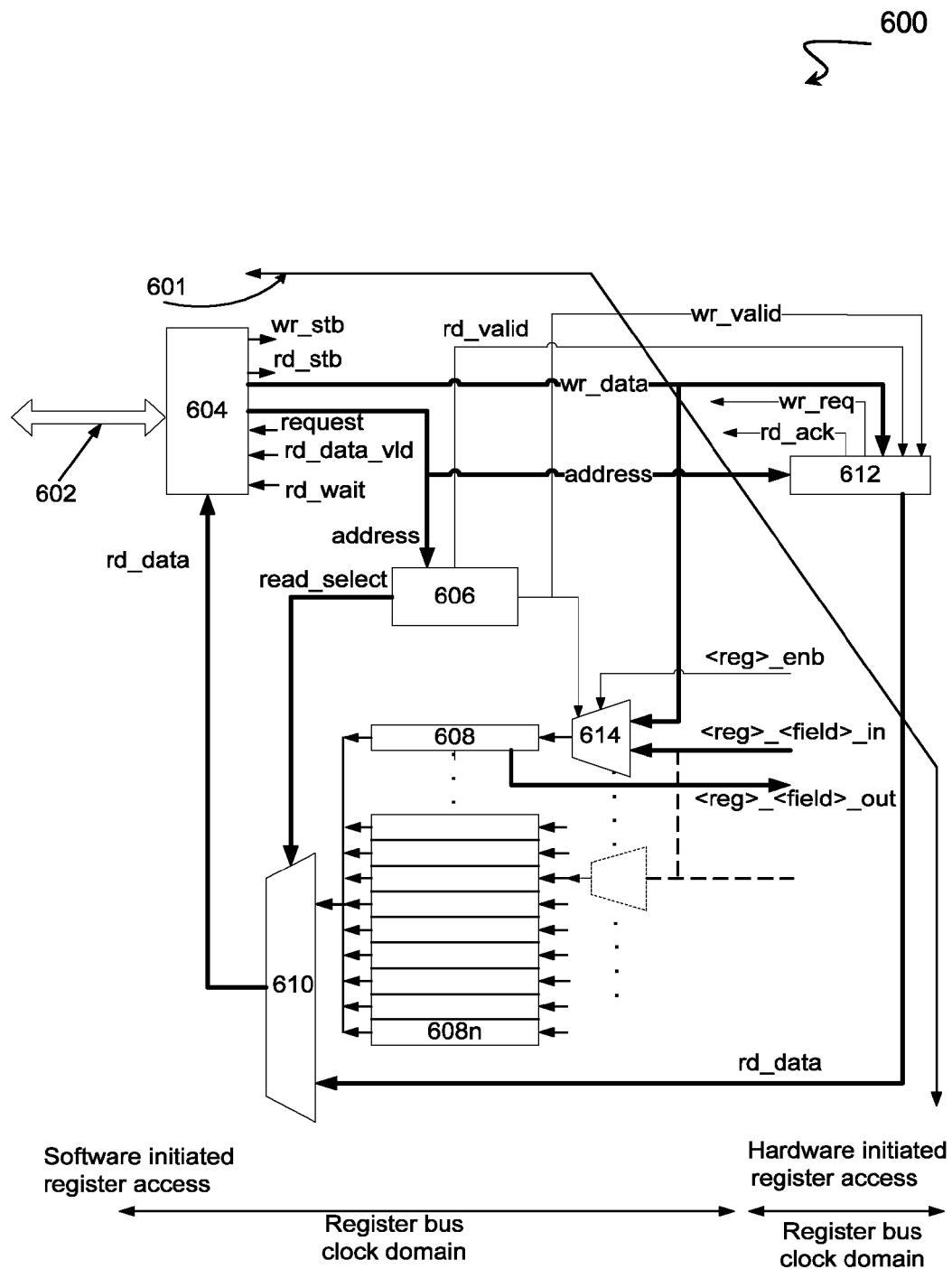
FIG. 6 illustrates an RTL (Register Transfer Logic) bus slave.

FIG. 6 illustrates an RTL bus slave 601 in a system 600. Based on the templates used in the document describing the device, as mentioned above, and template attributes, an appropriate RTL bus slave 601 may be generated. The document describing the device may also be the output document 508. The decoder 606 may be created from a relative positioning of the templates, one or more template offset properties, and one or more template repeat properties. One or more read-back muxes 610 may be created based on whether register fields, as shown in FIG. 9 described below, are readable by software, as specified by a value of a "sw access" attribute, where "sw access" indicates software access. Similarly, if the user specifies that the register field may be readable by a hardware, appropriate signals may be created for hardware access. When an external attribute is set to true, appropriate interface signals may be generated as described in more detail below. The RTL bus slave 601 may generate one or more synthesizable registers and one or more interfaces from the specification of the device. The following describes what may be generated and how the user may customize the generated output.

An embodiment of the present disclosure may generate one or more slave models for several industry standard buses such as AMBA-AHB® (Trademark of ARM Ltd.), Avalon® (Trademark of Altera Corporation), and any proprietary bus. A type of bus interface may be selected from a configuration pop-up window. Both VHDL and Verilog outputs may be possible. The generated logic is shown in FIG. 6. Bold lines may indicate multiple signals or a bus. Normal lines may indicate a single signal. Dashed lines may indicate a variable or selectable block or a variable or selectable signal.

A logic shown in the RTL bus slave 601 may be automatically generated. On the left side is a software-initiated register access, and on the right side is a hardware-initiated register access. It may be noted that the two register accesses may have their own clock domains. The two register accesses may be in different clock domains, i.e., each side may be driven by a separate clock. Further, clock-domain crossing circuits may be automatically generated for signals traversing the two clock domains.

An external bus 602 may be coupled to a bridge 604. The bridge 604 may convert the signals from the external bus 602 to an internal bus. A change to the external bus 602 may change the bridge 604 leaving the rest of the RTL bus slave 601 intact. A suitable bridge may be instantiated based on the bus chosen in a predetermined configuration, such as the configuration 304 shown in FIG. 3. If the user selects a proprietary bus, then the bridge 604 may not be implemented and the internal bus signals may appear on the RTL bus slave 601 port so that the user can instantiate a suitable bridge 604 between the proprietary bus and signals coupled to RTL bus slave 601, such as wr_stb (write strobe), rd_stb (read strobe), wr_data (write data), address (address bus), request (request), rd_data_vld (read data valid), rd wait (read wait), and rd_data (read data).

A decoder 606 may identify a register or a register group (reg_group), such as the reg_group 314 and the register 316 shown in FIG. 3, that may be accessed (read/written) by software. The decoder 606 may generate appropriate signals (reg<name>_decode, regroup<name>_decode) for the register or the register group. For the register groups, which may be groups of registers or groups of memories, which may have been set as external registers 612 by the user, the system 600 may create an address port (address bus) for further address decode. The decoder 606 may be coupled to read_select (read select), address (address bus), rd_valid (read valid), and wr_valid (write valid).

Internal registers 608 through 608n may be the registers that the embodiment of the present disclosure may generate. Appropriate ports may be provided depending on the hardware access set. For example, the data input port for a register field may be provided if and only if the register field has been marked as hardware-writeable ('rw' indicating read/write, or 'wo' indicating write only). As would be appreciated by a person having ordinary skill in the art, the registers may have register fields of other suitable access types, for example, write-to-set ('ws') and write-to-clear ('wc'). Similarly, a data output port may be provided if the data output port has been marked as hardware-readable ('rw' or 'ro'). The internal registers 608 through 608n may be coupled to a read-back mux 610, a write-mux 614, and <reg>_<field>_out. One or more components of the <reg>_<field>_out signals may be one or more contents of the register field read out by the hardware.

If a register or a register group is set as "External," such as external registers 612 (which may also be external memories), the register or the register group may not be created by the embodiment of the present disclosure. As indicated by the arrows for the RTL bus slave 601 in FIG. 6, the RTL bus slave 601 may not include the external registers 612. Instead, an interface port may be provided so that the user may create an implementation and attach it to the RTL bus slave 601. This may be appropriate for special purpose registers and memories. The external registers 612 may be coupled to address (address bus), rd_ack (read acknowledge), wr_req (write request), wr_data (write data), rd_valid (read valid), and wr_valid (write valid).

The read-back mux 610 may send the software read data back to the external bus 602 via the bridge 604. The read-back mux 610 may multiplex the data not just from the internal registers 608 through 608n but also from external registers 612 and external memories as well. The read-back mux 610 may be coupled to read_select, rd_data as output, rd_data as input, and the outputs of the internal registers 608 through 608n.

A write-mux 614 may be created when both software and hardware may initiate a write to the same register. These two accesses may be asynchronous and in case of a conflict, the hardware side may take priority. There may be more instances of the write-mux 614, in a given application, as indicated by a mux and additional signals shown using dashed lines. The write-mux 614 may be coupled to the internal register 608, wr_valid, <reg>_enb, wr_data, and <reg>_<field>_in. One or more components of the <reg>_<field>_in signals may be one or more contents to be written to the register field from the hardware.

Register groups may be treated the same way as registers may be in that the register groups may be implemented internally or externally. External register groups usually may be used for external memories. However, it may be possible to generate synthesizable logic for an external register group (reg_group having an external property set to true) by selecting a "Distributed decode and read-back" option. The "Distributed decode and read-back" option may create an RTL implantation for each of the external register groups along with corresponding address decode, a read-back mux, and a pipeline stage. The "Distributed decode and read-back" option may enable the user to distribute the decode and read-back logic such that the timing requirements on critical signals, for example, may be met.

FIG. 7 illustrates an exemplary VHDL output of an embodiment of the system of the present disclosure. The VHDL output may be synthesizable. The VHDL output may contain packages for appropriate records that describe the registers and the input/output ports.

FIG. 8 illustrates a C/C++ header of an embodiment of the system of the present disclosure. The C/C++ header file thus generated may be in a hierarchical format as shown. It is possible that in addition to C/C++ header files, C/C++ or other language API files may also be generated.

FIG. 9 illustrates an HTML (HyperText Markup Language) output for a register showing the register bits and respective positions of the register bits, a register field name, "sw" indicating a software property ('ro' (read-only)), "hw" indicating a hardware property ('rw' (read-write)), default value, and a description of the register.

FIG. 10 illustrates an exemplary IP-XACT® (Trademark of The Spirit Consortium) output of the system of the present disclosure.

Figure 11:
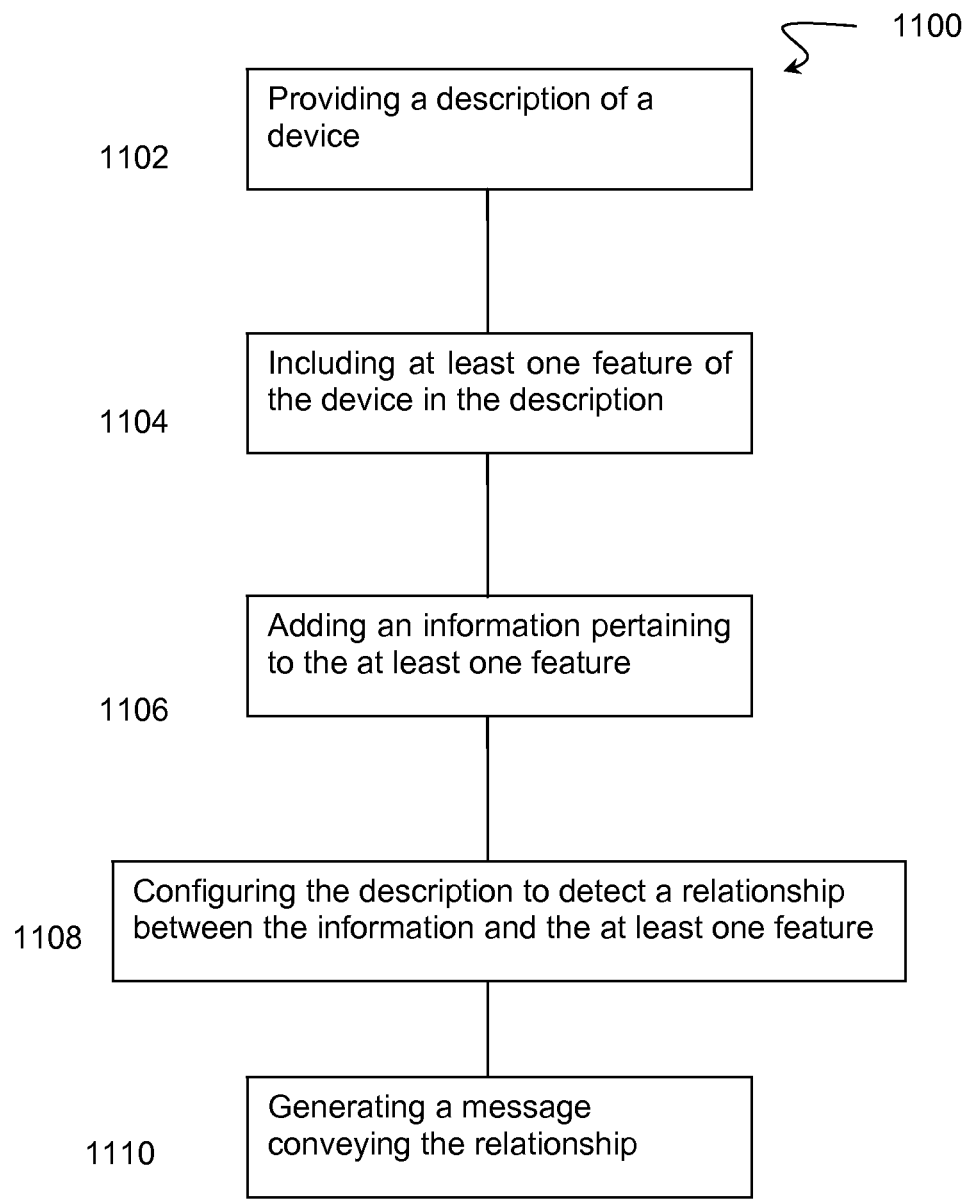
FIG. 11 illustrates an embodiment of a method of the present disclosure.

FIG. 11 illustrates an embodiment of a method 1100 of the present disclosure. FIG. 11 is a flowchart of the method 1100. The method 1100 may include providing a description of a device (block 1102) such as the functional specification 112 and the register specification 114 of FIG. 1, including at least one feature of the device in the description (block 1104), adding an information pertaining to the at least one feature (block 1106), configuring the description to detect a relationship between the information and the at least one feature (block 1108), and generating a message conveying the relationship (block 1110). An example of adding the information may be changing the at least one feature of the device in any manner. An example of configuring the description may be a processing of at least one of the functional specification 112 and the register specification 114 of FIG. 1. An example of the relationship may be a relationship pertaining to a performance, a layout, a structure, or a functionality, and the like, of the device.

The method 1100 may further include calculating a register address. The method 1100 may further include displaying a register address in the description of the device. In the method 1100, the description may be at least one of an electronic document and a paper document, such as at least one of the functional specification 112 and the register specification 114 of FIG. 1. In the method 1100, the providing the description may further include describing an interface of the device, such as the interfaces described in FIG. 6.

In the method 1100, the describing the interface may further include describing an interface between a hardware and a software. In the method 1100, the including the at least one feature of the device may have including at least one of a register and a bit. In the method 1100, the adding the information may include at least one of adding a property of a bit and adding a method of modifying a bit. It may be noted here that a register may be made of one or more bits. In the method 1100, the configuring the description may include interacting with at least one of an input file, an error checker, and an error handler. In an embodiment of the present disclosure, the error checker and the semantic validator 216 may be identical. In the foregoing embodiment or another embodiment of the present disclosure, the error handler and the annotation handler 210 may be identical. The input file may be at least one of the functional specification 112 and the register specification 114 of FIG. 1. In the method 1100, the configuring the description to detect a relationship may further include detecting at least one of a consistency and an inconsistency between the information and the at least one feature. The consistency may indicate an expected behavior or a normal performance. The inconsistency may indicate an unexpected behavior or an abnormal performance.

In the method 1100, the generating the message may further include generating at least one of an alarm, a guidance, and a suggested measure in at least one of a template, a table, and a window. The alarm, the guidance, and the suggested measure may be intended for the user to be used in modifying a performance or a functionality of an electronic device, such as an ASIC, an FPGA, a board, or a system. Further, the generating the message may include examining the at least one of a template, such as those described in FIGS. 2 and 3, a table, and a window for validity of an information included in the at least one of the template, the table, and the window. The template may be the one of the templates related to FIG. 3. The generating the message may be accomplished in the at least one output file 224 of FIG. 2.

In the method 1100, the method may be adapted to be performed in a single process of a computer operating system (OS). It may be possible to generate one or more outputs in a batch mode without a graphical interface. An example of the graphical interface may be the editor GUI 208. The graphical interface may include the document opened in the word processor. In the batch mode, all of the one or more outputs that may normally be generated in a GUI mode, such as that of the editor GUI 208, may also be generated without a need to bring up the document describing the device and press the generate 320 button described above. The method 1100 may capture the specification of the device efficiently, e.g., in a concise manner, such that one or more files may be generated from the method 1100. The method 1100 accomplishes such a generation because an entire task may be performed in a single OS process by implementing the method 1100 as a plug-in into the document editors such as Microsoft Word® (Trademark of Microsoft Corporation), OpenOffice.org, or FrameMaker (Trademark of Adobe Corporation).

The plug-in may be implemented in any language, supported by the Software Development Kit (SDK) of the document editor, such as Java® (Trademark of Sun Microsystems), .NET® (Trademark of Microsoft Corporation) or C or C++. When the user operates the generate button, such as the generate 320 button of FIG. 3, the same OS process that represents the editor GUI 208, of FIG. 2, checks the errors in the document, runs the semantic validator 216, the annotation generator 218, the error and annotation handler 210, followed by the output generator 220 assisted by the XSL transformer 214. During the generation process, errors may be shown in the editor GUI 208 at the appropriate location by the error and annotation handler 210. The foregoing takes place in the OS process running the word processor without spawning a new process.

The foregoing method 1100 or elements of the method 1100 could also be stored on a computer-readable storage medium having computer-executable instructions to implement the method 1100 or the elements of the method 1100. The computer-readable storage medium may include computer-executable instructions for providing a description of a device, including at least one feature of the device in the description, adding an information pertaining to the at least one feature, configuring the description to detect a relationship between the information and the at least one feature, and generating a message conveying the relationship.

Aspects of the present disclosure may take the form of an entirely hardware embodiment, an entirely software embodiment (including firmware, resident software, micro-code, etc.) or an embodiment combining software and hardware aspects that may all generally be referred to herein as a "circuit," a "module," or a "system." Moreover, aspects of the present disclosure may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples of the computer readable storage medium may include: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this disclosure, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the C language. The program code may execute entirely on the user's computer, partly on the user's computer, as a stand-alone software package, partly on the user's computer and partly on a remote computer or entirely on the remote computer or server. The remote computer may be connected to the user's computer through any type of network, including a local area network (LAN) or a wide area network (WAN), or the connection may be made to an external computer, e.g., through the Internet using an Internet Service Provider.

Aspects of the present disclosure have been described above with reference to flowchart illustrations and/or block diagrams of methods, apparatus (systems) and computer program products according to embodiments of the present disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational elements to be performed on the computer, other programmable apparatus or other devices to produce a computer implemented process such that the instructions which execute on the computer or other programmable apparatus provide processes for implementing the functions or acts specified in the flowchart and/or block diagram block or blocks.

Figure 12:
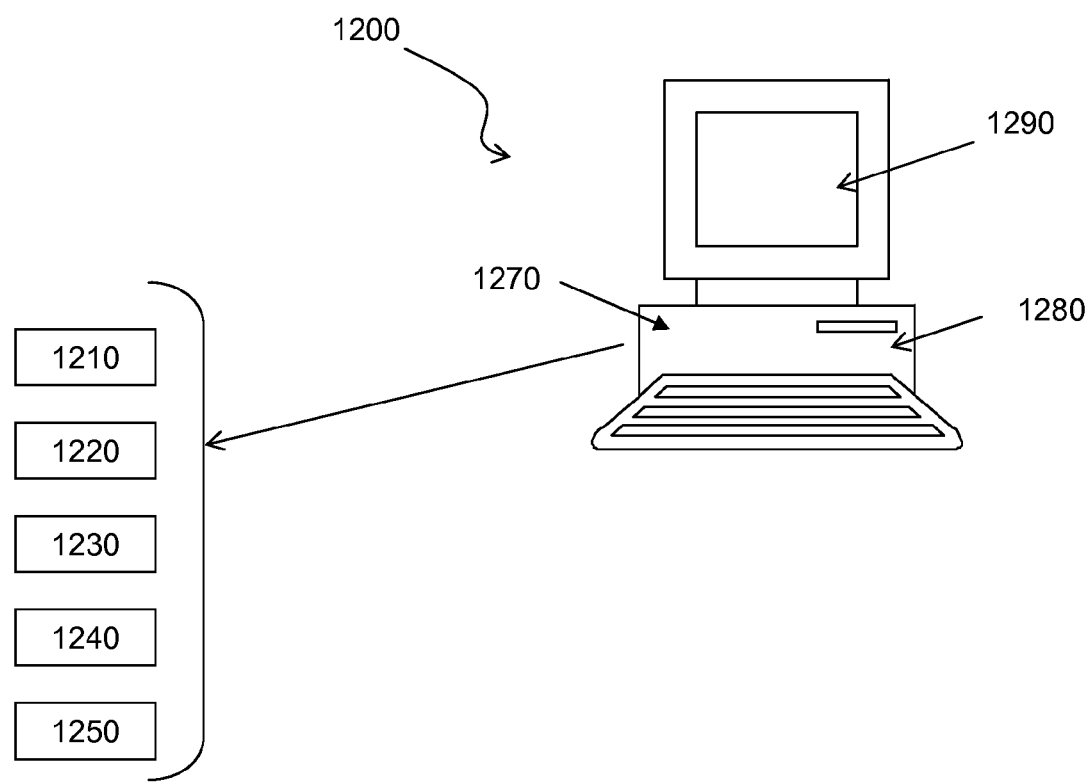
FIG. 12 illustrates another embodiment of a system of the present disclosure.

Referring now to FIG. 12, which illustrates another embodiment of a system 1200 of the present disclosure, the system 1200 is described. The system 1200 may include a first processor 1210 configured to provide a description of a device, a second processor 1220, the second processor 1220 being coupled to the first processor 1210, and the second processor 1220 being configured to include at least one feature of the device in the description, an adder 1230, the adder 1230 being coupled to the first processor 1210, and the adder 1230 being configured to add an information pertaining to the at least one feature, a detector 1240, the detector 1240 being coupled to the first processor 1210, and the detector 1240 being adapted to configure the description to detect a relationship between the information and the at least one feature, and a generator 1250, the generator 1250 being coupled to the first processor 1210, and the generator 1250 being coupled to generate a message conveying the relationship. The system 1200 may include a computer 1270 having the computer program product 1280. The device may be one or more of the configuration 304, the system 306, the board 308, the chip 310, the block 312, the reg_group 314, and the register 316 described in FIG. 3. Though the FIG. 12 shows unidirectional arrows, in a given application one or more unidirectional arrows may become a bidirectional coupling. An example of adding the information may be changing the at least one feature of the device in any manner. An example of configuring the description may be a processing of at least one of the functional specification 112 and the register specification 114 of FIG. 1. An example of the relationship may be a relationship pertaining to a performance, a layout, a structure, or a functionality, and the like, of the device.

In the system 1200, the system 1200 may further include a calculator, the calculator being coupled to the first processor 1210, and the calculator being configured to calculate a register address. In the system 1200, the system 1200 may further include a display device 1290, the display device 1290 being coupled to the first processor 1210, and the display device 1290 being configured to display a register address in the description of the device. In the system 1200, the description may be at least one of an electronic document and a paper document, such as at least one of the functional specification 112 and the register specification 114 of FIG. 1. In the system 1200, the first processor 1210 may be further configured to describe an interface of the device such as the interfaces described in FIG. 6.

In the system 1200, the first processor 1210 may be further configured to describe an interface between a hardware and a software, such as the interface(s) described in FIG. 6. In the system 1200, the second processor 1220 may be further configured to include at least one of a register and a bit, e.g., as described in FIG. 9. In the system 1200, the adder 1230 may be further configured to at least one of add a property of a bit and add a method of modifying a bit. In the system 1200, the detector 1240 may be further configured to interact with at least one of an input file, an error checker, and an error handler as described in FIG. 2. In an embodiment of the present disclosure, the error checker and the semantic validator 216 may be identical. In the foregoing embodiment or another embodiment of the present disclosure, the error handler and the annotation handler 210 may be identical. The input file may be at least one of the functional specification 112 and the register specification 114 of FIG. 1.

In the system 1200, the detector 1240 may be further configured to detect at least one of a consistency and an inconsistency between the information and the at least one feature. The consistency may indicate an expected behavior or a normal performance. The inconsistency may indicate an unexpected behavior or an abnormal performance. In the system 1200, the generator 1250 may be further configured to generate at least one of an alarm, a guidance, and a suggested measure in at least one of a template, a table, and a window. The alarm, the guidance, and the suggested measure may be intended for the user to be used in modifying a performance or a functionality of an electronic device, such as an ASIC, an FPGA, a board, or a system. The generator 1250 may be further configured to examine the at least one of a template, a table, and a window for validity of an information included in the at least one of the template, the table, and the window. The template may be one of the templates related to FIG. 3. The generator 1250 may be further configured to send a result of the foregoing examination to the at least one output file 224 of FIG. 2.

In the system 1200, the first processor 1210 may be further configured to describe an interface of the device; the second processor 1220 may be further configured to include at least one of a register and a bit; the adder 1230 may be further configured to at least one of add a property of a bit and add a method of modifying a bit; the detector 1240 may be further configured to interact with at least one of an input file, an error checker, and an error handler; the detector 1240 may be further configured to detect at least one of a consistency and an inconsistency between the information and the at least one feature; the generator 1250 may be further configured to generate at least one of an alarm, a guidance, and a suggested measure in at least one of a template, a table, and a window; and the generator 1250 may be further configured to examine the at least one of a template, a table, and a window for validity of an information included in the at least one of the template, the table, and the window. The input file may be at least one of the functional specification 112 and the register specification 114 of FIG. 1.

Further, the system 1200 may be adapted to be controlled by a single process of a computer operating system. It may be possible to generate one or more outputs in a batch mode without a graphical interface. An example of the graphical interface may be the editor GUI 208. The system 1200 may capture the specification of the device efficiently, e.g., in a concise manner, such that one or more files may be generated from the system 1200. The system 1200 accomplishes such a generation because an entire task may be performed in a single OS process by implementing the system 1200 as a plug-in into the document editors such as Microsoft Word® (Trademark of Microsoft Corporation). The graphical interface may include the document opened in the word processor. In the batch mode, all of the one or more outputs that may normally be generated in a GUI mode, such as that of the editor GUI 208, may also be generated without a need to bring up the document describing the device and press the generate 320 button described above.

The plug-in may be implemented in any language, supported by the Software Development Kit (SDK) of the document editor, such as Java® (Trademark of Sun Microsystems), .NET® (Trademark of Microsoft Corporation) or C or C++. When the user operates the generate button, such as the generate 320 button of FIG. 3, the same OS process that represents the editor GUI 208, of FIG. 2, checks the errors in the document, runs the semantic validator 216, the annotation generator 218, the error and annotation handler 210, followed by the output generator 220 assisted by the XSL transformer 214. During the generation process, errors may be shown in the editor GUI 208 at the appropriate location by the error and annotation handler 210. The foregoing takes place without spawning a new process.

Exemplary but non-limiting embodiments of the subject matter include the following:

In one embodiment, a method for making a computer-implemented apparatus tool to design an electronic circuit, performs some or all of the following steps:

providing a plug-in which interoperates with an application programming interface of at least one of a spreadsheet or a word processing program, providing a library of insertable templates compatible with a word processing program which receive data and enable consistency checks, and providing executable program code to read an input file. and generating an output file comprising a template or a spreadsheet.

In an embodiment, the method is improved by providing executable program code to validate data entered into said templates, In an embodiment, the method is improved by providing executable program code to transform the data entered into the templates of word processing files into a platform independent representation.

In an embodiment, the method is improved by providing executable program code to generate annotations, In an embodiment, the method is improved by providing executable program code to calculate annotations such as default values and addresses.

In an embodiment, the method is improved by providing executable program code to transmit annotations back to the graphical user interface of said spreadsheet or word processing program.

In an embodiment, the method is improved by providing executable program code to display a tool bar or menu bar within the word processing program comprising buttons for configuration, inserting entity templates, inserting hierarchical templates, checking the design, and generating output files.

In one embodiment, entity templates are registers and register groups.

In another or the same embodiment, hierarchy templates are blocks, chips, boards, and systems.

In another or the same embodiment, output files may be selected by configuration buttons to be customized file formats or standards such as but not limited to Verilog or VHDL.

An other aspect of the invention is a computer-implemented batch method for operation of a processor coupled to a computer-readable instruction and data store which has some or all of the following steps:

reading from computer-readable data store a register specification containing at least one embedded entity template as an input file;

locating and processing data entered into each embedded entity template;

creating at least one entity when a template is read in an input file;

creating a hierarchy when a hierarchical template is read in an input file.

In an embodiment, this batch method is improved by examining a template for validity of information, generating a result of the examination, sending a result of an examination to at least one output file. In an other or the same embodiment, the method may include on the condition that a register group has an "external" property set to true, providing an interface port; creating a write-mux; creating ports on the RTL such that user can connect his own implementation for the "external" register group; and creating an RTL implantation with a corresponding address decode, a read-back mux, and a pipeline stage.

In an other or the same embodiment, the method may include upon identifying a register group which may be accessed by software, generating appropriate signals for the register group;

creating an address port for further address decode; upon determining that a register field has been marked as hardware-writable, providing a data input port; and upon determining that a register field has been marked as hardware-readable, providing a data output port.

In an other or the same embodiment, the batch method may include upon determining that signals traverse two clock domains, generating a clock domain crossing circuit; upon determining that a user has selected a proprietary bus, generating logic for an RTL bus slave circuit; and checking for an error.

The method is distinguished from conventional methods by calculating an address of an entity; annotating said address onto an instance of the entity template in the original input file, and generating an output file as selected by a configuration.

In an embodiment, a selectable output file is in a synthesizable language.

In the same or an other embodiment, an output file is in a simulatable language.

The method is easily distinguished from conventional methods for word processing because an entity may be a register group comprising a start template, a plurality of register templates, and an end template.

The method is also distinguished by providing a hierarchy template such as but not limited to one of block template, chip template, board template, or system template among other things.

Another aspect of the invention is a computer-implemented interactive method for operation of a processor coupled to a graphical user interface display terminal, a computer-readable instruction and data store which performs some or all of the following steps:

displaying a toolbar of icons within a graphical user interface of a word processing application program; upon user selection of a template icon, embedding an entity template into a document; upon user selection of a hierarchy icon, and embedding a hierarchy template into a document.

In an embodiment, the method is improved by receiving information from the user to enter into the template; detecting an error in information entered into the template; modifying the document in a dynamic manner; performing checks on the document for semantic consistency; and upon user command, generating a derived view from the document.

In the same or an other embodiment, the method includes
locating and processing data entered by the user into a template embedded into a document; and generating additional program code to help ensure a compliance to constraints during simulation or operation.

In the same or another embodiment, the interactive method is improved by checking for consistency as data are entered into a table by a user; generating a feedback to the user; displaying a visual feedback in the graphical user interface; and performing consistency checks when data is written out.

The interactive method is distinguished from conventional word processing by calculating an address dynamically, displaying an address on the document in a graphical user interface.

The method is easily distinguished by performing the steps providing a tool bar and a menu bar to a user for insertion of a set of templates, receiving a user command, when a tool bar or menu bar is operated to insert an entity template into a document, and receiving a user command, when a tool bar or menu bar is operated to insert a hierarchy template into a document.

In the same or an other embodiment, the method includes
receiving a user command, when a tool bar or menu bar is operated to check a design for errors, show error in the document, calculate a data address, calculate a register address, and annotate the addresses in the template, receiving a user command, when a tool bar or menu bar is operated to generate selected output files, as selected by a configuration, and receiving a user command, when a tool bar or menu bar is operated to present a menu of configuration choices of selectable output files.

In the same or an other embodiment, the method has the steps creating and updating a document checking data entered by a user for semantic validity, correct syntax, and hierarchy, check for overall errors in the data entered by a user, show errors in a graphical user interface, upon receiving a user command, inserting a selected template and setting a property of the template, validating user entered data semantically, generating annotation, feeding back annotations to the graphical user interface for display, transforming a user description into a platform independent format. and upon receiving a user command, initiating all the processes available for batch methods of operation.

The method is easily distinguished by an entity template which may be a register, or a group of registers.

In the same or another embodiment, a hierarchical template is a block, a chip, a board, and a system, a start of a register group and an end of register group.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As used in this specification and appended claims, the singular forms "a," "an," and "the" include plural referents unless the specification clearly indicates otherwise. The term "plurality," if used, includes two or more referents unless the specification clearly indicates otherwise. Further, unless described otherwise, all technical and scientific terms used herein have meanings commonly understood by a person having ordinary skill in the art to which the disclosure pertains.

As a person having ordinary skill in the art would appreciate, the elements or blocks of the methods described above could take place at the same time or in an order different from the described order.

It should be emphasized that the above-described embodiments are merely some possible examples of implementation, set forth for a clear understanding of the principles of the disclosure. Many variations and modifications may be made to the above-described embodiments of the invention without departing substantially from the principles of the invention.

All such modifications and variations are intended to be included herein within the scope of this disclosure and the present invention and protected by the following claims.

The invention claimed is:

1. A method for configuring a processor coupled to a graphical user interface display terminal apparatus into a computer-implemented apparatus tool to design an electronic circuit, comprising:
   encoding onto non-transitory computer readable storage medium a plug-in which interoperates with an application programming interface of at least one of a spreadsheet or a word processing program;
   encoding onto non-transitory computer readable storage medium a library of insertable templates compatible with a word processing program which receive data and enable consistency checks;
   encoding onto non-transitory computer readable storage medium executable program code to transform the data entered into the templates of word processing files into a platform independent representation encoded onto non-transitory computer readable storage medium;
   encoding onto non-transitory computer readable storage medium executable program code to calculate default values and addresses; and
   encoding onto non-transitory computer readable storage medium executable program code to store default values and addresses into said platform independent representation encoded onto non-transitory computer readable storage medium.

2. The method of claim 1 further comprising
   encoding onto non-transitory computer readable storage medium executable program code to display a tool bar or menu bar within the word processing program comprising buttons for configuration; for insertion of entity templates; for insertion of hierarchical templates; for validation of the design; and for generation of output files, wherein entity templates are registers and register groups, and wherein hierarchy templates are blocks, chips, boards, and systems.

3. A computer-implemented batch method for operation of a processor coupled to a computer-readable instruction and data store comprising:
   reading from a non-transitory computer-readable data store medium a register specification generated in a document editor of a word processing program having an ability to add templates for register, register group, block, chip, board and system, having been checked for semantic consistency as data was entered into while templates were added by a user, the register specification containing at least one embedded entity template as an input file;
   locating and processing data entered into each embedded entity template;
   creating at least one entity tangibly encoded on non-transitory computer readable data store medium when a template is read in an input file; and
   creating a hierarchy tangibly encoded on non-transitory computer readable data store medium when a hierarchical template is read in an input file, wherein
   an entity is a register group comprising a start template, a plurality of register templates, and an end template; and wherein
   a hierarchical template is at least one of a block template, a chip template, a board template, and a system template.

4. The method of claim 3 further comprising;
   on the condition that a register group has an "external" property set to true, providing an interface port;
   creating a write-mux;
   creating ports on the RTL such that user can connect his own implementation for the "external" register group; and
   creating an RTL implantation with a corresponding address decode, a read-back mux, and a pipeline stage.

5. The method of claim 3 further comprising:
   calculating an address of an entity; and
   annotating said address onto an instance of the entity template into a platform independent representation encoded onto non-transitory computer readable storage medium.

6. The method of claim 5 further comprising:
   generating at least one output file as selected by a configuration wherein a first output file is a synthesizable language, and a second output file is a simulatable language.

* * * * *